United States Patent [19]

Charles

[11] Patent Number: 4,865,644

[45] Date of Patent: Sep. 12, 1989

[54] SUPERCONDUCTING NIOBIUM ALLOYS

[75] Inventor: Robert G. Charles, Hampton Twp., Allegheny County, Pa.

[73] Assignee: Westinghouse Electric Corporation, Pittsburgh, Pa.

[21] Appl. No.: 76,972

[22] Filed: Jul. 23, 1987

[51] Int. Cl.$^4$ .......................... C22C 27/00; C22C 1/02
[52] U.S. Cl. ...................................... 75/84.5; 75/0.5 B
[58] Field of Search ............... 75/84.4, 84.5, 84, 0.5 B

[56]  References Cited

U.S. PATENT DOCUMENTS

| | | | |
|---|---|---|---|
| 3,425,825 | 2/1969 | Wilhelm | 75/84.4 |
| 4,149,876 | 4/1979 | Rerat | 75/84.4 |
| 4,465,511 | 8/1984 | Sale et al. | 75/84.4 |
| 4,725,312 | 2/1988 | Seon et al. | 75/84.4 |

FOREIGN PATENT DOCUMENTS

| | | | |
|---|---|---|---|
| 61-64831 | 4/1986 | Japan | 75/84.4 |
| 86/07097 | 12/1986 | PCT Int'l Appl. | 75/84.4 |

*Primary Examiner*—Stephen J. Lechert, Jr.
*Assistant Examiner*—Eric Jorgensen
*Attorney, Agent, or Firm*—Joyce L. Morrison; Richard D. Fuerle

[57] ABSTRACT

This disclosure discloses a method of making a niobium alloy having the general formula $Nb_yM$ where M is aluminum, gallium, indium, tin, germanium, silicon, or a mixture thereof. A niobium halide having the formula $NbX_y$ is reactive with M in a solution of a liquid alkali metal, where X is halogen and y is the valence of niobium. Also disclosed are spherical particles of the superconducting niobium alloy which are made by this method and a wire and magnet made from these particles.

20 Claims, No Drawings

SUPERCONDUCTING NIOBIUM ALLOYS

BACKGROUND OF THE INVENTION

Superconducting wire made of niobium alloys can be produced by encapsulating preformed fine particles of the alloy in tubes of a ductile metal, such as copper, and then drawing the filled tubes to the desired wire diameter. This procedure is used because these alloys are so brittle that they cannot be drawn directly into wire.

For example, the superconducting niobium alloy $Nb_3Sn$ can be formed into wire using that procedure. This alloy can be prepared in fine particle form by reacting niobium trichloride and stannous chloride molten sodium metal according to the following reaction:

$$3NbCl_3 + SnCl_2 + 11Na \rightarrow Nb_3Sn + 11NaCl$$

A related superconducting alloy, $Nb_3Al$, is superior to $Nb_3Sn$ for some applications, and can also be drawn into wire in the same manner. However, $Nb_3Al$ cannot be easily formed by reacting niobium and aluminum chloride in molten sodium.

SUMMARY OF THE INVENTION

I have discovered that $Nb_3Al$ and other niobium superconducting alloys having an $Nb_3M$ structure can be prepared by heating a niobium halide with the powdered preformed M metal in a reaction mixture containing a liquid alkali metal. For example, $Nb_3Al$ can be prepared by the following reaction $$3NvCl_3 + 9Li + Al \rightarrow Nb_3Al + 9LiCl$$

Here the alkali metal (in this case Li) has the dual function of chemical reductant (for the niobium halide) and solvent (for the preformed metal M). I have further found that the superconducting material produced by this method is in the form of very small spherical particles, less than one micron in diameter. Because these particles are spherical, they can be more easily drawn into wires, and the resulting wires are expected to have superior properties to wires of an identical alloy prepared by another method. Such properties may include tensile strength, ductility, critical temperature, critical magnetic field, and critical current density.

The method of this invention is relatively simple, does not require elaborate or expensive preparative equipment, is relative rapid, and is capable of giving essentially 100% yields of materials.

RELEVANT ART

U.S. Pat. No. 4,050,147 discloses a process for making superconducting niobium alloys, including Nb3Al, by reacting, in a hydrogen plasma, a halogenide of niobium or vanadium with another compound, incorporating the product particles in a metallic matrix, compacting the matrix, and fabricating the product.

U.S. Pat. No. 4,419,125 describes a process for making superconducting alloys, including Nb3Al, by preparing a mixture of halides of niobium and the alloy metal, and co-reducing the mixture of metal halides with an excess of liquid alkali metal.

DESCRIPTION OF THE INVENTION

The starting materials for preparing the superconducting niobium alloys according to the method of this invention include a niobium halide having the general formula $NbX_y$, where X is halogen and y is a valence of niobium. Niobium can have a valence of 2, 3, 4, or 5, and suitable halogens include chlorine, fluorine, bromine, and iodine. Examples of suitable niobium halides include $NbCl_5$, $NbF_3$, $NbBr_3$, $NbI_3$, but the preferred niobium halide is $NbCl_3$, as that compound is readily available, non-volatile, and seems to work well in the process. Mixtures of niobium halides where the niobium is of different valences or the halide ion is different are also contemplated. If a niobium halide such as $NbCl_5$ is used, which is volatile, it may be necessary to seal the reactor to prevent it from distilling out before it reacts.

The second reactant in the process of this invention is the metal to which the niobium is to be alloyed. Suitable metals include aluminum, gallium, indium, tin, germanium, silicon, and mixtures thereof. The preferred alloying metals are aluminum, tin, germanium, and silicon, as they form niobium alloys having superior superconducting properties. The most preferred alloying metal is aluminum as $Nb_3Al$ has the best superconducting properties.

The reaction that results in the preparation of the alloy according to the method of this invention occurs in a liquid alkali metal in which the niobium halide is reduced and the alloying metal M is soluble. Suitable liquid alkali metals include lithium and sodium, but lithium is preferred because liquid lithium is a better solvent for the reactant M.

In the method of this invention, the niobium halide and the alloying metal are added to a bath of the liquid alkali metal, preferably in stoichiometric proportions as deviations from stoichiometric do not seem to present any advantages and may make the reaction more difficult. The proportion of liquid alkali metal to the other reactants is not critical, but it is preferable to use about 5 to about 12 times the amount stoichiometrically required as this makes it easier to perform the reaction. The mixture is heated, preferably in an inert atmosphere, such as argon, to prevent reactions between atmospheric gases and the reactants. While temperatures as high as about 800° C. can be used, the temperature is preferably about 700° to about 800° C., for about one-half to about two hours, as that temperature range results in a more homogeneous product having a better particle size. The reaction is a follows:

$$3NbX_y + M + 3yA \rightarrow Nb_3M + 3yAX$$

where X is halogen, M is the alloying metal, A is the liquid alkali metal, and y is the valence of niobium. While I do not wish to be bound by any theories, I believe that the reaction may actually occur in two stages:

Stage I:

$$NbX_y + yA \rightarrow Nb + yAX$$

Stage II:

$$3Nb + M \rightarrow Nb_3M$$

The product of the reaction is very fine spherical particles of the superconducting niobium alloy. These particles can vary in particle size, depending upon the conditions of the reaction, but are generally less than one micron in diameter.

The by-products of the reaction, the alkali metal halide, and unreacted alkali metal, can be removed using a mixture of ethanol and water. The ethanol reacts with the unreacted liquid alkali metal to give an alkali metal alkoxide and an alkali metal hydroxide. The particulate superconducting particles can then be separated from the liquid phase by, for example, filtration, centrifugation, or other means. This procedure can then be followed by washing as required in water. The destruction of the alkali metal reactant with an alcohol and water generates gaseous hydrogen which reacts with the superconducting niobium alloy to give an undesirable intermetallic hydride, such as niobium aluminum hydride. The hydrogen can, however, be driven off with moderate heat. The necessary temperature range for carrying out this operation can be established by heating a sample in an initially evacuated quartz tube equipped with a pressure transducer.

It is noteworthy that unalloyed niobium also forms a hydride when excess lithium is treated with ethanol and/or water. However, the niobium hydride can be distinguished from the niobium aluminum hydride by the fact that the niobium hydride evolves hydrogen in a single step as the temperature is raised linearly with time. By contrast, the niobium aluminum hydride evolves hydrogen in two well-defined steps, perhaps indicating that hydrogen is at distinct but nonequivalent sites in the crystal lattice. The difference in thermogram appearance provides a diagnostic tool for identifying preparations where the formation of the niobium aluminum may not have gone to completion. The thermograms can also be used as "fingerprints" to establish the identity of products obtained in separate runs.

The formation of hydrides can be avoided, if the alkali metal is lithium, by exposing the completed reaction to nitrogen, thereby removing the lithium as the solid, lithium nitride, according to the reaction $$6Li + N_2 \rightarrow Li_3N$$

The above reaction can be monitored using the pressure of nitrogen; when the nitrogen pressure no longer falls the reaction is over. The lithium nitride can then be removed by the addition of water:

$$Li_3N + H_2O \rightarrow NH_3 + LiOH$$

The alloy-forming reaction is preferably carried out in a sealed titanium vessel which constitutes part of a specially designed and high capacity differential thermal analysis (DTA) apparatus. By using this type of equipment, the various stages of the reaction can often be followed in terms of the heat given off or taken up during a chemical or physical change in the reaction mixture. The temperature of the reaction mixture can be raised linearly with time (typically at about 10° C./min) and/or held at a predetermined temperature for a chosen length of time.

Care should be taken to avoid a sudden large rise in temperature during the exothermic reaction in which the niobium alloy is formed because that may lead to rapid crystal growth of the niobium particles formed in the first stage of the reaction, exposing less surface area of the niobium particles to the alloying metal in the second stage of the reaction. Also, a sudden large temperature increase may result in sintering of the initially produced fine particles to form aggregates which may be difficult or impossible to break up in subsequent processing.

A sudden temperature increase may be avoided by adding to the reaction mixture, before the exothermic reaction occurs, a solid fusible inert salt having a suitable melting point chosen to coincide with the reaction exotherm; the heat generated by the exothermic reaction is absorbed as the salt melts endothermically. This salt should have a melting point between about 450° and 600° C. as salts with lower melting points may prevent the reaction from occurring until all the salt has melted, and salts with higher melting points permit too large of a temperature increase; a preferred melting point for the salt is about 450° to about 500° C. The salt should be inert (i.e., unreactive) and non-corrosive to the reaction vessel; it is also preferably water soluble, so that it can be easily removed. Sufficient salt should be added so that the heat absorbed by the heat of fusion of the salt equals or exceeds the heat generated by the reaction, though this may not be easy to calculate and may have to be experimentally determined; up to a 20% excess is desirable as a precaution. The salt is preferably added as the reaction mixture is being composed, though it may be added at any point prior to the exotherm. Examples of salts that can be used and their melting points is given in the following table.

| Individual Salts | |
|---|---|
| Compound | Melting Point (°C.) |
| LiCl | 610 |
| LiBr | 547 |

| Salt Mixtures | | |
|---|---|---|
| Compounds | Composition | Melting Point (°C.) |
| LiCl—KCl | Eutectic | 450 |
| NaCl—MgCl$_2$ | Eutectic | 450 |
| MgCl$_2$—KCl | Eutectic | 470 |
| LiBr—BaBr$_2$ | Eutectic | 483 |
| LiCl—CaCl$_2$ | Eutectic | 496 |
| NaCl—CaCl$_2$ | Eutectic | 500 |
| LiCl—NaCl | 66.3 to 33.7% by wt. | 552 |
| KCl—MgCl$_2$ | 61.4 to 38.6% by wt. | 426 |
| CaCl$_2$—NaCl | 67.2 to 32.8% by wt. | 500 |

The preferred salt is LiCl because, if the alkali metal is lithium and the halogen is chloride, it is already present in the reaction as a byproduct.

The separation of the excess alkali metal from the niobium alloy when the reaction is complete and partially cooled can be facilitated by the addition of an inert (i.e., unreactive) liquid compound that has a density intermediate to the densities of alkali metal and the niobium alloy. Since lithium has a density of 0.53 gms./cc. and Nb$_3$Al has a density of about 8 gms./cc., this separator compound should have a density between 0.5 and 8 gms./cc., and ideally would be midway between these values, if the alkali metal is lithium and the alloying metal is aluminum. The preferred separator liquids are straight chain organic hydrocarbons. These typically have densities much closer to that of Li than that of Nb$_3$Al. Nevertheless, the density differences are sufficient to effect the desired separation. The following table gives some examples of suitable straight chain hydrocarbons.

| Compound | Formula | Melting Point (°C.) | Boiling Point (°C.) | Density g/cc |
|---|---|---|---|---|
| n-Undecane | C$_{11}$H$_{24}$ | −26 | 196 | 0.740 |
| n-Dodecane | C$_{12}$H$_{26}$ | −10 | 216 | 0.749 |
| n-Tridecane | C$_{13}$H$_{28}$ | −6 | 230 | 0.757 |
| n-Tetradecane | C$_{14}$H$_{30}$ | 6 | 251 | 0.764 |
| n-Pentadecane | C$_{15}$H$_{32}$ | 10 | 268 | 0.769 |

-continued

| Compound | Formula | Melting Point (°C.) | Boiling Point (°C.) | Density g/cc |
|---|---|---|---|---|
| n-Hexadecane | $C_{16}H_{34}$ | 18 | 280 | 0.775 |
| n-Heptadecane | $C_{17}H_{36}$ | 22 | 303 | 0.777 |
| n-Octadecane | $C_{18}H_{38}$ | 28 | 308 | 0.777 |
| n-Nonadecane | $C_{19}H_{40}$ | 32 | 330 | 0.777 |

Of the above compounds, n-hexadecane and n-octadecane are preferred as they are readily available and inexpensive. Also, because their melting points are near room temperature, they can easily be obtained as either solids or liquids using slight cooling or heating. The significance of the convenient melting points is that these substances can be added in the liquid state to effect the Li-Nb$_3$Al separation. By then lowering the temperature a few degrees the long chain hydrocarbon freezes. This allows one to extrude the layered separation mixture from the separation vessel as a single body which can be cut apart with a knife. Any residual hydrocarbon in the Nb$_3$Al product layer can be removed by washing with a more volatile hydrocarbon such as n-hexane.

Wires can be made, for example, from the product alloy powder by packing the powder in a cylinder of a ductile metal, such as copper, and drawing the cylinder to the requisite diameter. Magnets can be prepared from the wire by winding it to form a coil.

The following example further illustrates this invention:

EXAMPLE

Into an argon-filled glove box was placed 4.42 grams ($2.22 \times 10^{-2}$ moles) of powdered niobium trichloride, 0.200 gram ($7.41 \times 10^{-3}$ moles) finely divided aluminum metal, and 2.00 grams (a four-fold excess) of pelleted lithium metal. The filled titanium reaction vessel was sealed within the glove box and was then removed to the external DTA apparatus. The gas (argon) atmosphere within the tube was then pumped to a pressure below 300 torr (preferably below 1 torr) and the tube was resealed.

The reaction mixture was heated linearly with time to a maximum temperature of about 800° or 850° C. and was then cooled at approximately the same rate. (Alternatively, the mixture can be held at the maximum temperature for periods of 0.5 to 2 hours or more prior to cooling.) As the temperature was raised an endotherm was first observed due to the melting of the lithium; this was followed at about 440° C. by a very large and sharp exotherm which corresponded to the formation of Nb$_3$Al or Nb. A small endotherm which was observed at a higher temperature was believed to be due to the melting of the lithium chloride formed in the reaction. No other significant peaks were observed up to 800° C., which indicated the absence of any fast chemical reactions between 500° and 800° C. Slow reactions, or those which occurred over extended temperature ranges, would not be detected.

The cold reaction mixture was treated with portions of ethanol and water in a ratio of one part ethanol to one part water until the evolution of hydrogen ceased. The black particulate product was filtered off on a Teflon Millipore filter and was washed repeatedly on the filter with water. Finally, the product was dried in a vacuum desiccator at room temperature for at least 16 hours. Removal of hydrogen from hydrides that had formed was effected by heating the dried material in vacuum at a temperature of about 500° C. The product was identified as Nb$_3$Al of the A15 crystal structure by a combination of techniques including X-ray diffraction analysis, scanning electron microscopy (SEM), and non-dispersive X-ray elemental analysis. Low temperature magnetic measurements were used to establish the superconducting characteristics of the alloy. The SEM analysis showed that the particles of Nb$_3$Al had the requisite size, size uniformity, and spheroidal shape required for forming superconducting wires. The value of the superconducting transition temperature $T_c$ has been found to vary with the specific reaction conditions used in the preparation of the Nb$_3$Al alloy. However, $T_c$ values as high as 16.8° K. were observed for some preparations.

I claim:

1. A method of making a niobium alloy having the general formula Nb$_3$M where M is selected from the group consisting of aluminum, gallium, indium, tin, geranium, silicon, and mixtures thereof, comprising reacting NbX$_y$ with M in a solution comprising a liquid alkali metal, where X is halogen and y is the valence of the niobium and an inert solid salt that has a melting point between about 450° C. and about 600° C. in an amount sufficient to absorb the exothermic heat of said reaction.

2. A method according to claim 1 wherein M is selected from the group consisting of aluminum, tin, germanium, silicon, and mixtures thereof.

3. A method according to claim 2 wherein M is aluminum.

4. A method according to claim 1 wherein said liquid alkali metal is selected from the group consisting of lithium, sodium, and mixtures thereof.

5. A method according to claim 4 wherein said liquid alkali metal is lithium.

6. A method according to claim 5 including the additional last steps of exposing said solution to nitrogen to remove excess lithium by forming lithium nitride, and adding water to decompose said lithium nitride into ammonia and lithium hydroxide.

7. A method according to claim 1 wherein X is chlorine.

8. A method according to claim 1 wherein M is Al, y is 3, X is Cl, and said liquid alkali metal is lithium.

9. A method according to claim 1 wherein said solution is held at a temperature of about 450° to about 600° C. for about ½ to about 2 hours.

10. A method according to claim 1 wherein said solution is in an inert atmosphere.

11. A method according to claim 1 wherein said solution is an argon.

12. A method according to claim 1 wherein said salt is water soluble.

13. A method according to claim 1 wherein said alkali metal is lithium, said halogen is chlorine, and said salt is LiCl.

14. A method according to claim 1 including the additional last step of adding to the solution an inert compound that has a density between the density of said alkali metal and the density of said niobium alloy to separate said alkali metal from said niobium alloy.

15. A method according to claim 14 wherein said inert compound is a straight chain hydrocarbon.

16. A method of making Nb$_3$Al comprising heating a solution of aluminum metal in liquid lithium in the presence of solid NbCl$_3$ in an inert atmosphere.

17. A method according to claim 16 wherein said solution is heated at about 450° to about 600° C. for about ½ to about 2 hours.

18. A method according to claim 17 including the additional last step of removing by-products using a mixture of ethanol and water.

19. A method according to claim 16 wherein an amount of solid lithium chloride sufficient to absorb the exothermic heat of said reaction by melting is included in said liquid lithium.

20. A method according to claim 16 including the additional last steps of exposing said lithium to nitrogen to remove excess lithium by forming lithium nitride, and adding water to decompose said lithium nitride into ammonia and lithium hydroxide.

* * * * *